(12) United States Patent
Greene et al.

(10) Patent No.: US 9,000,807 B2
(45) Date of Patent: Apr. 7, 2015

(54) ON-CHIP PROBE CIRCUIT FOR DETECTING FAULTS IN AN FPGA

(71) Applicant: Microsemi SoC Corporation, San Jose, CA (US)

(72) Inventors: Jonathan W. Greene, Palo Alto, CA (US); Dirk Kannemacher, Neustadt am Ruebenberge (DE); Volker Hecht, Barshinghausen (DE); Theodore Speers, San Jose, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 13/933,332

(22) Filed: Jul. 2, 2013

(65) Prior Publication Data

US 2014/0002136 A1    Jan. 2, 2014

Related U.S. Application Data

(60) Provisional application No. 61/667,296, filed on Jul. 2, 2012.

(51) Int. Cl.
| | |
|---|---|
| *H03K 19/00* | (2006.01) |
| *H03L 7/06* | (2006.01) |
| *H03K 19/02* | (2006.01) |
| *H03L 7/00* | (2006.01) |

(52) U.S. Cl.
CPC . *H03K 19/02* (2013.01); *H03L 7/00* (2013.01)

(58) Field of Classification Search
CPC ...... G06F 1/10; H03K 19/0963; H03K 5/135; H03L 7/00

USPC ............ 326/93, 16; 327/141, 208–212, 214, 327/215; 716/108, 136
See application file for complete search history.

(56) References Cited

U.S. PATENT DOCUMENTS

| | | | | |
|---|---|---|---|---|
| 5,727,021 | A * | 3/1998 | Truebenbach | 375/226 |
| 6,356,514 | B1 | 3/2002 | Wells et al. | |
| 6,518,812 | B1 * | 2/2003 | Sikkink et al. | 327/284 |
| 6,642,760 | B1 * | 11/2003 | Alon et al. | 327/158 |
| 6,720,810 | B1 * | 4/2004 | New | 327/158 |
| 7,072,433 | B2 * | 7/2006 | Bell | 375/376 |
| 7,155,651 | B2 | 12/2006 | Nadeau-Dostie et al. | |
| 7,202,656 | B1 | 4/2007 | Gearhardt et al. | |

(Continued)

OTHER PUBLICATIONS

Abramovici et al., "BIST-Based Delay-Fault Testing in FPGAs," Journal of Electronic Testing: Theory & Applications, 2003, pp. 549-558, vol. 19, No. 5.
Chmelar, "FPGA Interconnect Delay Fault Testing," Proc. Int'l Test Conf. (ITC 03), 2003, pp. 1239-1247.

(Continued)

*Primary Examiner* — Dylan White
(74) *Attorney, Agent, or Firm* — Leech Tishman Fuscaldo & Lampl; Kenneth D'Alessandro

(57) ABSTRACT

An integrated circuit includes a clock input, a first output, and a second output. A programmable pulse generator has a programmable pulse counter coupled to the clock input at least one control input for receiving count information. A fixed delay element is coupled to the programmable pulse counter. A programmable delay element is coupled to the programmable pulse counter and has at least one control input for receiving delay information. A first multiplexer is coupled to the fixed delay element, the programmable delay element and to the first output. A second multiplexer is coupled to the programmable delay element, the output of the fixed delay element and the second output.

9 Claims, 8 Drawing Sheets

(56) References Cited

U.S. PATENT DOCUMENTS

| | | | |
|---|---|---|---|
| 7,240,266 B2* | 7/2007 | Farmer et al. | 714/731 |
| 7,375,570 B2 | 5/2008 | Gearhardt et al. | |
| 2009/0039867 A1* | 2/2009 | Saint-Laurent et al. | 324/102 |
| 2009/0039932 A1* | 2/2009 | Kim | 327/161 |

OTHER PUBLICATIONS

Kobayashi, "AppNote 5202: PLL Control Circuit Example for FastScan/TestKompress," AppNotes, Jul. 15, 2005, 16 pages.

Madge et al., "Obtaining High Defect Coverage for Frequency-Dependent Defects in Complex ASICs," IEEE Design & Test of Computers, Sep.-Oct. 2003, pp. 46-53.

* cited by examiner

ON-CHIP PROBE CIRCUIT FOR DETECTING FAULTS IN AN FPGA

BACKGROUND

1. Field of the Invention

The present invention relates to field-programmable-gate-array (FPGA) integrated circuit technology. More particularly, the present invention relates to on-chip circuits for testing an FPGA for the presence of delay defects.

2. Prior Art

Traditionally, integrated circuits are only tested for functional defects (those that become apparent no matter how slowly the chip is operated). However as semiconductor technology scales, it becomes necessary to check for delay defects as well. A typical example of a delay defect is a contact having an unduly high resistance.

Methods for testing for delay defects in nonprogrammable integrated circuits, such as standard cell ASICs, are known in the prior art. Some of these are applicable also to programmable integrated circuits, including FPGAs. Other testing methods are specific to programmable integrated circuits.

There are three general categories of known test methods: at-speed functional test with the intended design; scan chain testing; and methods specific to programmable logic devices. Each is considered in turn.

In at-speed functional testing, the circuit is tested by running it as in normal operation, but using the highest specified clock frequency. This can be very effective for non-programmable integrated circuits, or for programmable integrated circuits that are already programmed with the intended design and will not be reprogrammed. However for programmable integrated circuits, the need to use the highest specified clock frequency is problematic, since this frequency is very design-dependent and end-user designs are not known at the time of testing.

Scan chains are a widely used technique for performing functional testing of non-programmable integrated circuits (e.g. standard cell ASICs). The various flip-flops in an integrated circuit are connected together to form a shift register scan chain independent of the normal functional logic. By putting the flip-flops in a special scan mode, test data can be shifted into and/or out of the flip-flops.

Scan chains can also be used to test for delay defects. There are two methods for using scan chains to perform delay-defect testing, launch from shift and launch from capture. One example is found in R. Madge, B. R. Benware and W. R Daasch, "Obtaining High Defect Coverage for Frequency-Dependent Defects in Complex ASICs, IEEE Design & Test of Computers," September-October 2003, pp. 46-53.

Common to both methods is that two clock pulses are applied at high speed and path delays exceeding the intervening time are detected. First, a test pattern is loaded using the scan chain. Signals are then launched through the delay paths either by a last pulse of the clock in scan mode ("launch from shift"), or by pulsing the clock in normal mode ("launch from capture"). After a suitable delay, the outputs of the delay paths are captured in the flip-flops by another pulse of the clock, in normal mode. In some cases it may be desirable to pulse the clock multiple times in normal mode before reading out the data.

An FPGA programmed with a particular design can also be tested for delay defects using launch and capture pulses if some means (analogous to a scan chain) is provided to control and observe the flip-flops. In an FPGA, alternatives for controlling and observing the flip-flops include a hard (built-in) scan chain, a soft (programmed as part of the design) scan chain, and a read/write probe circuit using row/column addressing. In the following discussion, the term "scan chain" will be considered to include any of these or other similar means for controlling and observing the flip-flops.

When using launch and capture pulses for delay testing, it is crucial to precisely control the intervening interval, since this governs the time allowed for the signals to propagate through the paths under test. Various circuits and methods for doing so are known in the prior art.

Several examples of such circuits and methods are disclosed in AppNote 5202 of Jul. 15, 2005 from Mentor Graphics, describing an on-chip generator for creating two pulses, one for launch and one for capture, on the same output. The spacing between the pulses is determined by the frequency of an incoming clock, with no ability to adjust it. There is also no ability to alter the number of pulses.

U.S. Pat. No. 7,155,651 describes a complex on-chip controller capable of delivering various numbers of pulses on the scan and system clocks. The number of pulses is programmable. The timing of the pulses is determined by two "reference clocks," the "functional clock" used during normal operation and a separate shift clock. It does not appear to be possible, let alone convenient, to alter the frequency of the clocks and thus the delay from launch to capture.

U.S. Pat. No. 7,202,656 describes a scheme for "launch from capture" testing. An on-chip PLL provides a high-frequency output, and an on-chip pulse counter passes exactly two pulses from the PLL output to the system clock. The delay between the two pulses can only be controlled by adjusting the PLL frequency, which is not always convenient.

U.S. Pat. No. 7,375,570 describes a scheme for "launch from capture" testing where the launch and capture pulses are both delivered over a single system clock. The length of each pulse is controlled by an on-chip delay line. The launch and capture pulses are triggered by two separate signals from the tester with rapid and precise relative timing. Not all testers are capable of providing such signals.

Persons of ordinary skill in the art will observe that none of these prior art methods provide a convenient way to control the launch-capture interval. They either require a sophisticated tester, or a clock whose period equals the desired interval or is an exact multiple of the desired interval. In particular, there is no way to achieve fast launch-capture intervals that are less than the minimum clock period.

Several other methods for delay testing have been developed specifically for FPGAs which take advantage of their programmability.

U.S. Pat. No. 6,356,514 describes a method for measuring delays through logic in an FPGA. The chip is programmed to implement one or more free-running ring oscillators which include the desired delay path. The output of the oscillator is connected to on-chip counters to measure its frequency and duty cycle. It is not clear from this reference if the counters are intended to be built with programmable logic or hard circuitry.

This scheme has several disadvantages. First, clock-to-output delays through flip-flops may only be incorporated into the ring by adding delay elements to reset the flip-flop after some suitable delay, which must be safely below the period of the oscillator. In addition, the scheme does not appear to support measurement of setup times at flip-flop inputs. Further, some of the programmable logic and routing is consumed to either implement the counters or convey the oscillator outputs to a central hard-logic counter. This increases the number of test designs that are required to be sure all circuitry is included in at least one ring oscillator. If a central hard counter is used, it may become a bottleneck preventing testing of multiple oscillators simultaneously, increasing test time.

Another category of delay testing methods for FPGAs works by detecting differences in delay on pairs of paths with matching nominal delay (i.e. two equivalent paths that should have identical delays). If the actual delays of the matched paths differ significantly, it indicates a defect. Two such methods have been described in the prior art.

E. Chmelar, "FPGA Interconnect Delay-Fault Testing," Proc. Int'l Test Conf. (ITC 03), 2003, pp. 1239-1247, describes a delay fault test technique using paths of matched nominal delay in an FPGA with a special delay mismatch detection circuit. However the delay mismatch tolerance is determined by the actual delay of a certain routing path, which is quite inflexible. Altering the tolerance requires reprogramming the FPGA to insert or remove routing resources in the path. Reprogramming the FPGA unnecessarily increases total test time.

M. Abramovici and C. Stroud, "BIST-based delay-fault testing in FPGAs," Journal of Electronic Testing: Theory & Applications, Vol. 19, No. 5, pp. 549-558, 2003, suggest using paths of matched nominal delay in FPGAs and detecting mismatches using a counter. Their approach has several disadvantages. The use of counters has the same drawbacks cited above in connection with the ring oscillator scheme. The precision of the delay discrimination is limited by the maximum frequency of the counters. Finally, if a central counter is used, it is difficult to convey the high-speed pulses from the ends of the paths under test to the central counter.

For volume production it may sometimes be desirable to test FPGAs for use with a specific customer design. In this case, defects in circuitry not used by the particular design can be ignored. Even in this case however the testing is still generally performed by programming multiple test designs into the chip.

BRIEF DESCRIPTION

An integrated circuit includes a programmable pulse generator has a programmable pulse counter coupled to a clock input at least one control input for receiving count information. A fixed delay element is coupled to the programmable pulse counter. A programmable delay element is coupled to the programmable pulse counter and has at least one control input for receiving delay information. A first multiplexer is coupled to the fixed delay element, the programmable delay element and to a first output. A second multiplexer is coupled to the programmable delay element, the output of the fixed delay element and a second output. The pulse generator may be used to test for delay faults in logic circuitry in the integrated circuit, to perform scan chain functional testing, and to test various integrated-circuit clock functionality.

BRIEF DESCRIPTION OF THE DRAWING FIGURES

FIG. 1 is a block diagram of an illustrative pulse generator that may be used in practicing the present invention.

FIGS. 2A, 2B, and 2C are block diagrams of some illustrative pulse generators having additional flexibility that may be used in practicing the present invention.

DETAILED DESCRIPTION

Persons of ordinary skill in the art will realize that the following description of the present invention is illustrative only and not in any way limiting. Other embodiments of the invention will readily suggest themselves to such skilled persons.

The present invention may be used to test an FPGA for the presence of delay defects. These are defects that become apparent only during high-speed operation. Such defects change (usually increase) the delay on signal paths, yet do not alter the functionality of the FPGA at lower-speed operation. It is desirable to perform the necessary testing as quickly as possible using a readily available and inexpensive tester external to the FPGA.

In addition to the programmable logic fabric, testing should also cover other timing-critical components in the FPGA, such as those used to generate and condition clock signals. Examples are: oscillators, delay lines; delay locked loops (DLLs); phase locked loops (PLLs); and clock dividers.

It is desirable to be able to test the FPGA in both of two different modes. First, it is desirable to be able to test unprogrammed FPGAs. Here the FPGA may be tested by configuring it to implement one or more specially-chosen test designs (the fewer the better). It is also desirable to be able to test pre-programmed FPGAs already configured to a specific end-user design. In this case the test must be performed using the end-user design since the FPGA cannot be further reconfigured.

Modern FPGAs contain several features that may facilitate testing, such as PLLs, clock dividers, flexible global clock distribution networks, and real-time counters. An efficient testing method should take advantage of these capabilities. In addition, small amounts of circuitry may be added to the FPGA to facilitate testing provided the area of the FPGA is not significantly increased.

According to the invention, a chip will include a pulse generator that is both built-in and programmable. It is intended for use in testing, and is not typically used by the end-user design, although this might be possible in some cases.

Figure 1:
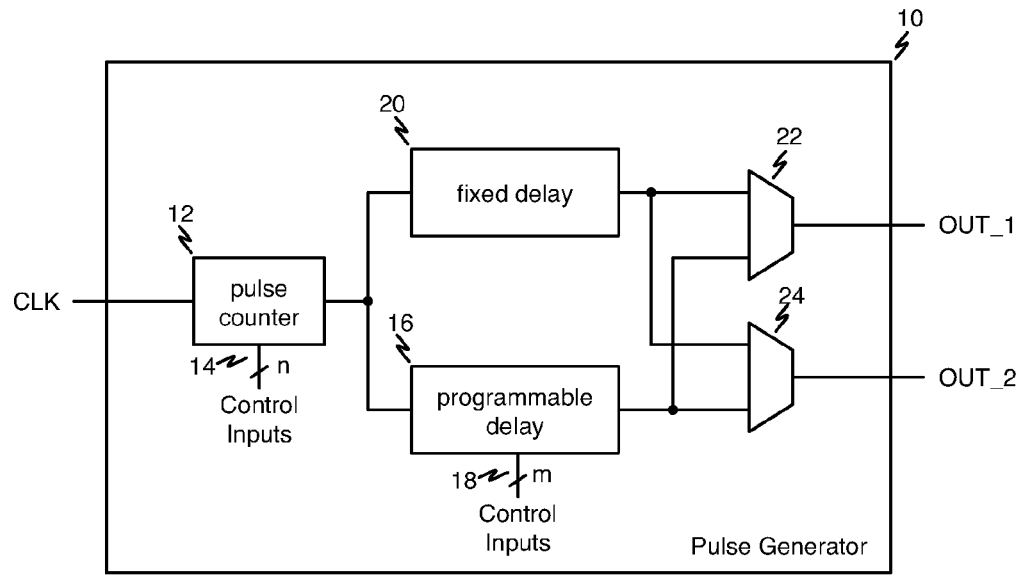

Referring now to FIG. 1, a block diagram shows one illustrative embodiment of a basic implementation of an on-chip pulse generator 10 according to the present invention. This basic version of the pulse generator has one clock input CLK and two outputs, OUT_1 and OUT_2. The clock input is driven by a continuously-running clock. Pulse generator 10 includes a pulse counter 12 that may be set by means of control inputs 14 to pass a specified number of clock pulses after which its output remains low. A programmable delay 16 is coupled to the output of pulse counter 12 and may be set by means of control inputs 18 to delay the signal appearing at its input by a specified delay before sending it out. A fixed delay 20 compensates for the minimum delay through the programmable delay 16. Multiplexers 22 and 24 select one of the output of the programmable delay 16 and the fixed delay 20 to their inputs to pass through to one of the two outputs OUT_1 and OUT_2. Because the output of each delay line can be routed through multiplexers 22 and 24 to either pulse generator output, OUT_1 can either be ahead or behind OUT_2.

The signals controlling the pulse counter 12, programmable delay 16 and multiplexers 22 and 24 may come from an on-chip test controller, directly from off chip (e.g., from an external tester), or be set as part of the FPGA configuration. In a preferred embodiment, the pulse counter 12, programmable delay 16 and multiplexers 22 and 24 can all be controlled either directly or indirectly by the tester without the need to reprogram the FPGA.

Exemplary implementation parameters of the pulse generator are an input frequency from arbitrarily slow to as much as 400-500 MHz, the ability of the pulse counter to pass from 1 to 32 clock pulses, a programmable delay of zero to 16 or zero to 32 steps of 80 ps each, and a fixed delay matching the minimum delay through the programmable delay 16, or such a minimum delay less one step.

The clock input CLK to the pulse generator 10 may be driven from off chip by the tester, or from on chip by an oscillator or PLL. Since a PLL offers the most flexibility and one is generally available in an FPGA, this alternative is preferred. As is often the case in recent FPGAs, the PLL should be equipped with programmable dividers at its reference and feedback inputs so that its output frequency can be set to N/M times that of a reference clock, where M is the divisor for the reference clock input divider and N is the divisor for the feedback input divider. The outputs of the pulse generator 10 should each be able to drive one or more or all of the global clock distribution networks of the FPGA.

Table 1 below summarizes the capabilities of the basic pulse generator 10 shown in FIG. 1. The term $\Delta$ is the programmed delay value, $\Delta_{max}$ is used to indicate the maximum programmable delay value, $\Delta_0$ the minimum programmable delay value (which is also the fixed delay value), and T to indicate the period of the incoming clock signal. Provided that T can be adjusted to any value greater than $(\Delta_{max}-\Delta_0)$, any launch-capture interval can be achieved. For fast intervals, the launch and capture pulses must be delivered on different outputs.

TABLE 1

Modes for Basic Pulse Generator

| Mode | Pulses delivered on same or different outputs? | Counter Initialization value | Number of pulses delivered | Interval between pulses |
|---|---|---|---|---|
| Fast launch-capture | different | 1 | 2 (first on one output, second on the other) | $(\Delta-\Delta_0)$ |
| Slow launch-capture | same | 2 | 2 | T |
| Slow launch-capture | same | N | N | T |

In some cases it may not be convenient to adjust T. For instance, if the clock is produced by a PLL, adjusting the period requires waiting for the PLL to re-lock. This may take 20-40 μsec in current technology. Also, if multiple pulse generators share one PLL, they must be using the same frequency.

Figure 2A:
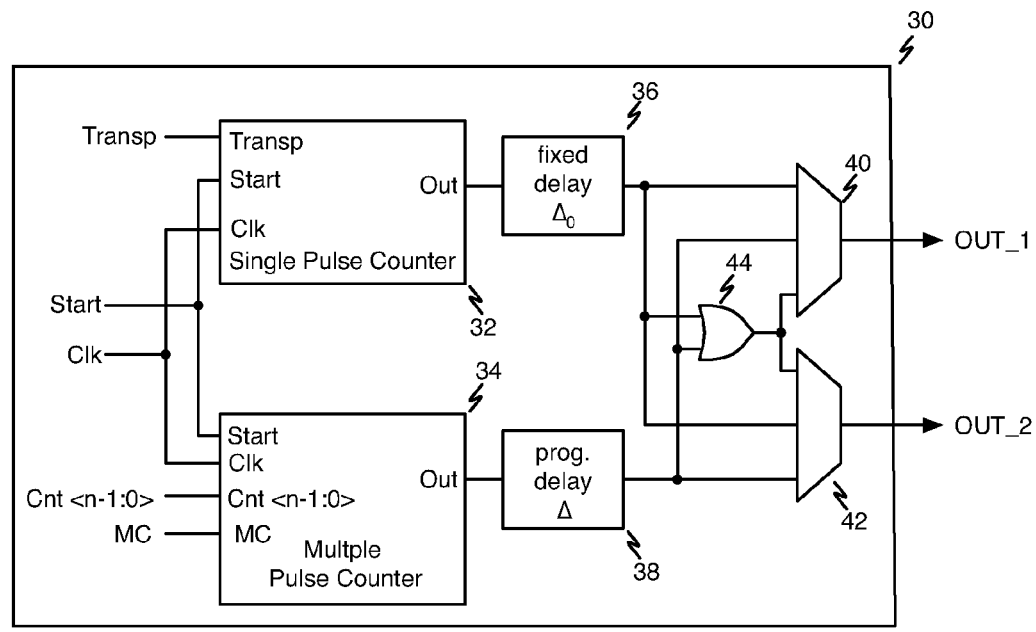
FIG. 2D is a timing diagram showing the operation of the pulse generators of FIGS. 2A through 2C.

Referring now to FIG. 2A, another more flexible pulse generator 30 is shown that can achieve any launch-capture interval without needing to adjust T, provided T<($\Delta$max-$\Delta_0$). If TRANSP is low and the START input is raised, the single pulse counter 32 passes a single pulse from the CLK input. This will generally be used to provide a launch pulse. Alternatively, if TRANSP is high, the single pulse counter 32 becomes transparent, passing the free-running CLK input directly through the fixed delay line 36 and multiplexers 40 and 42 to one or both outputs OUT_1 and OUT_2. When the multicycle MC control input is set high and the START input is raised, the multiple pulse counter 34 passes the specified number N of clock pulses simultaneously to programmable delay line 38. When the MC input is set low and the START input is raised, the N+1st clock pulse is sent to the programmable delay line 38. This will generally be used to produce a capture pulse. If N is set to 0, then the launch and capture pulses are separated only by the programmable delay. If N is set to a positive value, the launch and capture pulses are separated by N clock cycles plus the programmable delay. The launch and capture pulse may be delivered separated on different outputs OUT_1 and OUT_2 through multiplexers 40 and 42. If N>0, the launch and capture pulses may be combined using the OR gate 44 onto a single output. The OR gate 44 should be designed to have symmetric delays from each of its inputs. Table 2 below summarizes the capabilities of the flexible pulse generator 30 of FIG. 2A.

TABLE 2

Modes for Flexible Pulse Generator

| Mode | Pulses delivered on same or different outputs? | Counter Initialization value | MC | Number of pulses delivered | Interval between pulses |
|---|---|---|---|---|---|
| Fast launch-capture | different | 0 | 0 | 2 | $(\Delta-\Delta_0)$ |
| Slow launch-capture | either | N > 0 | 0 | 2 (both on same output, or first on one output and second on the other) | NT + $(\Delta-\Delta_0)$ |
| multi-cycle | same | N | 1 | N | T |

Figure 2B:
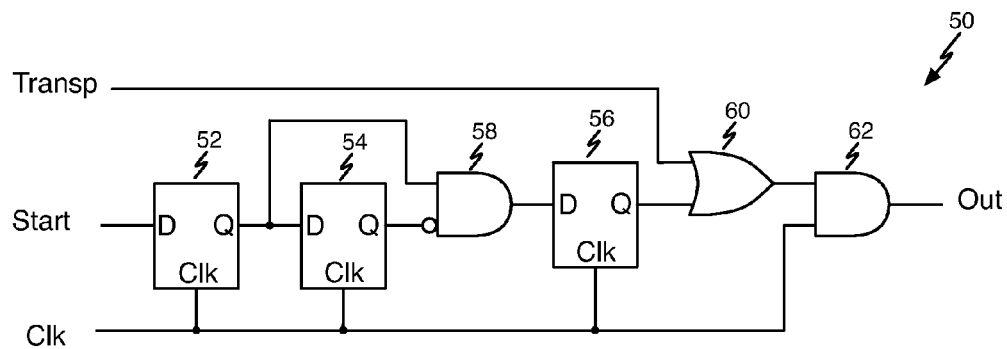

Referring now to FIG. 2B, an illustrative implementation of a single pulse generator is shown.

Figure 2C:
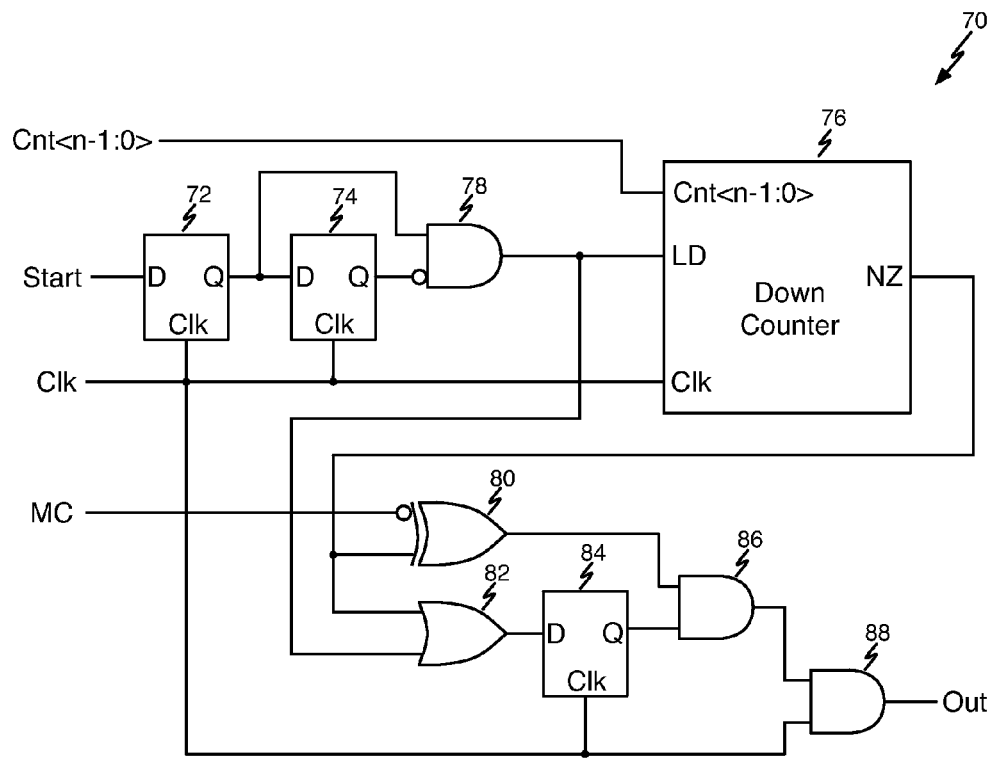
Figure 2D:
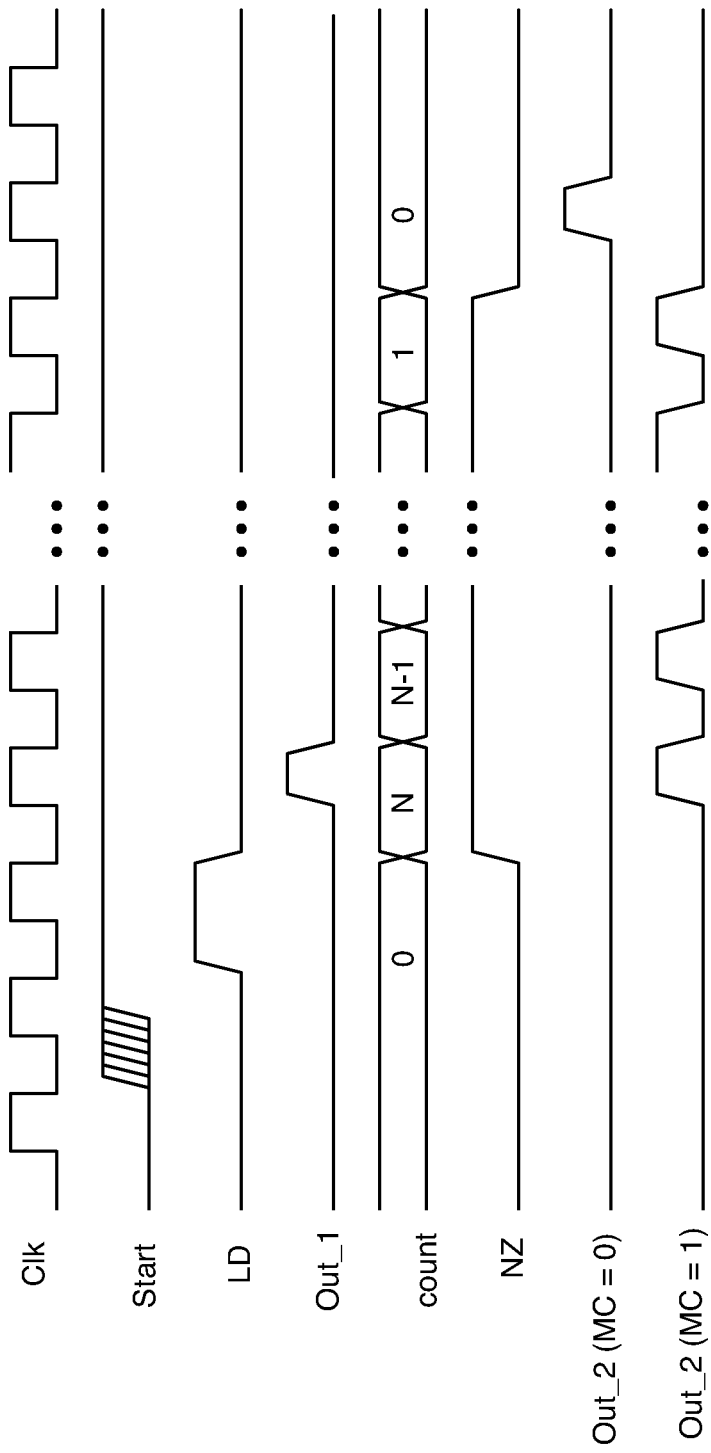

Referring now to FIG. 2C, an illustrative implementation of a multiple pulse generator is shown. At the first clock edge after the LD input goes high, the down counter 76 loads the initial count specified by its CNT inputs. If this count is greater than zero, the NZ ("non-zero") output goes high. When the count returns to zero, NZ drops low. The flip-flops in FIGS. 2B and 2C are initially reset to Q=0, and the down counter is initially reset to a count of zero with NZ=0. The reset can be forced either when START is low, or by a separate reset signal (not shown in the figures). FIG. 2D is a waveform diagram illustrating the operation of the circuits in FIGS. 2A-2C.

In certain circumstances, it may be advisable to provide an additional chain of flip-flops between the START input in FIG. 2A and the START inputs to the two pulse counters 32 and 34. This can ensure proper synchronization of the START signal to the incoming clock. A chain of four flip-flops are typically used for this purpose. The Q output of one flip-flop in the chain is coupled to the D input to the succeeding flip-flop, and all are clocked on the falling edge.

For additional flexibility, it may also be beneficial to provide circuitry to optionally invert the outputs of the single and multiple pulse counters before they proceed to the output OR gate and multiplexers.

Pulse generator circuits such as those shown in FIG. 1 and FIGS. 2A through 2C may be used to perform various types of tests in the FPGA integrated circuits in which they are contained. In some cases additional aspects of the invention are required, and those are described herein as well.

Typical scan chain functional testing can be done as follows. The appropriate stimulus is loaded into the flip-flops by scan chain (or other means). Then the pulse generator is used to apply one or more pulses to the flip-flops via a single global clock line. The resulting values in flip-flops can then be observed via scan.

This scheme can also be used for delay testing if the maximum allowable delay is identical for each segment of the path from one flip-flop to the next. This is the case when a particular end-user design is being tested. It will also be the case for general testing of a programmable integrated circuit if the test design carefully balances the nominal delays of each segment of the path.

Figure 3:
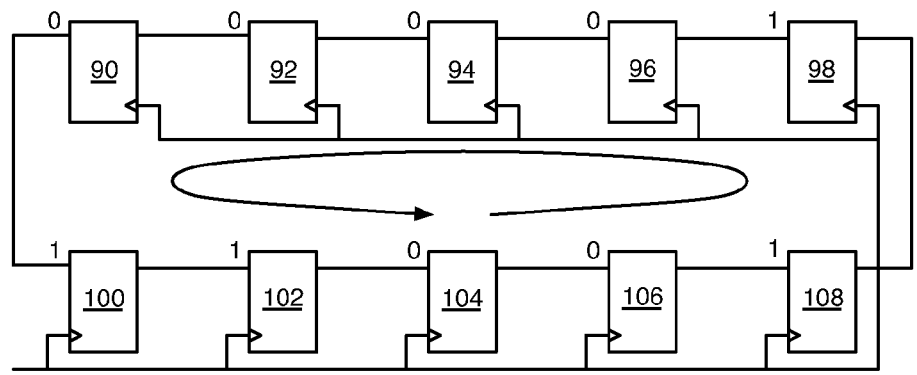
FIG. 3 is a block diagram showing a loop configuration.

As illustrated in FIG. 3, to which attention is now drawn, an especially useful design for testing FPGA routing in this way includes a loop of flip-flops including flip-flops 90, 92, 94, 96, 98, 100, 102, 104, 106, and 108. As will be appreciated by persons of ordinary skill in the art, routing resources or even single-fan-in logic (not shown in FIG. 3) may be present between each pair of adjacent flip-flops. By applying multiple clock cycles, a test pattern can be shifted around the loop to test for faults in the routing between any adjacent ones of flip-flops 90, 92, 94, 96, 98, 100, 102, 104, 106, and 108. To save time, the flip-flops can be set only at the start of the multiple cycle sequence, and observed only after the sequence is complete. Loading the set of flip-flops with a pattern like 00110011 . . . is useful because all four transitions (0 to 0, 0 to 1, 1 to 0, 1 to 1) will occur at each stage as the pattern is clocked around the loop.

Loops configurations are especially easy to design for FPGA fabrics that include "U-turns" in the routing tracks at the boundaries of the array. Such FPGAs include Xilinx FPGAs (e.g., see FIG. 1 of U.S. Pat. No. 6,888,374). A particular advantage of a loop configuration for delay testing is that the clock skews around the loop must sum to zero; this allows one to exclude clock skew when measuring data delays. If the loop contains exactly one flip-flop, clock skew is eliminated altogether and measuring data delays is especially simple.

Figure 4A:
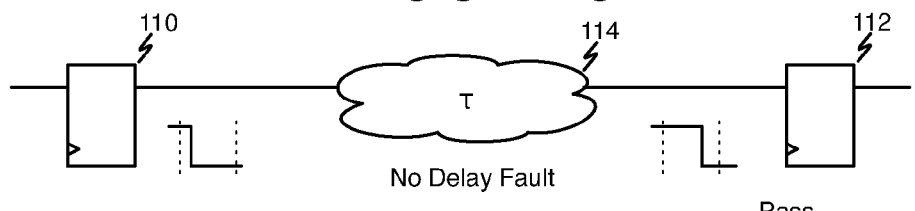
FIGS. 4A and 4B are block diagrams illustrating launch-capture delay testing according to one aspect of the present invention.
Figure 4B:
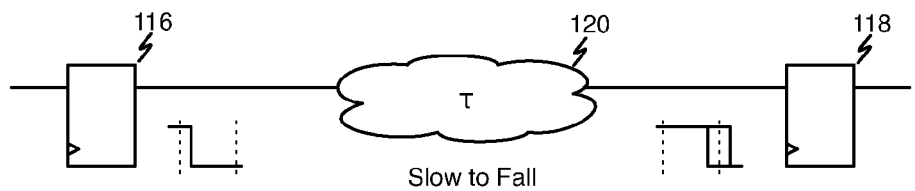

Scan-chain based ATPG testing of frequency-dependent defects requires that there be an appropriate time difference between launch of the test vector and the resultant capture of the test vector. Referring now to FIGS. 4A and 4B, the launch/capture test concept is shown based on a slow-to-fall transition delay fault.

In FIG. 4A, the output of flip-flop 110 transitions from a high state to a low state. The output of flip-flop 110 is coupled to the input of flip-flop 112 via a network whose delay is represented at reference numeral 114. As represented by the waveforms adjacent to flip-flops 110 and 112, flip-flop 110 transitions as a result of a launch clock pulse occurring at the leftmost vertical dashed line. The transition propagates through delay 114, resulting in a timing shown by the waveform adjacent to flip-flop 112. The capture signal is represented by the rightmost vertical dashed line. As may be seen from FIG. 4A, the delay at reference numeral 114 is too short to cause a fault, since the waveform is already at a low state at the time of the capture pulse.

In FIG. 4B, the output of flip-flop 116 transitions from a high state to a low state. The output of flip-flop 116 is coupled to the input of flip-flop 118 via a network whose delay is represented at reference numeral 120. As represented by the waveforms adjacent to flip-flops 116 and 118, flip-flop 116 transitions as a result of a launch clock pulse occurring at the leftmost vertical dashed line. The transition propagates through delay 120, resulting in a timing shown by the waveform adjacent to flip-flop 118. The capture signal is represented by the rightmost vertical dashed line. As may be seen from FIG. 4B, the delay at reference numeral 120 may be long enough to cause a fault, since the waveform may not yet have transitioned to a low state at the time of the capture pulse.

Figures 5A, 5B:
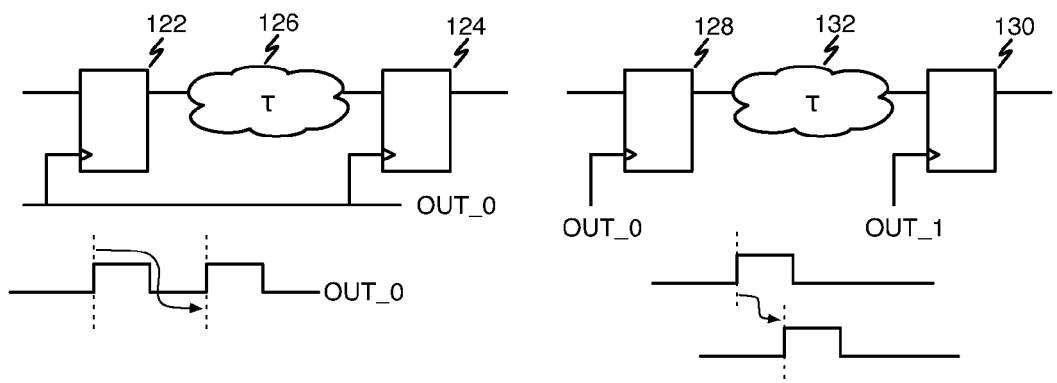
FIGS. 5A and 5B are diagrams showing two possible implementations of launch-capture delay testing according to the present invention.

FIGS. 5A and 5B illustrate two possible implementations. FIG. 5A shows a typical launch-capture test method. In the scheme shown in FIG. 5A, both flip-flops 122 and 124 are driven by the same pulse generator output via a single low-skew clock network. The output of flip-flop 122 drives the input of flip-flop 124 through a network having a delay represented by reference numeral 126. The launch and capture occur on two adjacent clock cycles, where the clock period (shown as the interval between the two vertical dashed lines) dictates the interval between the launch and capture events.

FIG. 5B shows how two different clock networks may be used for launch and capture. In the scheme shown in FIG. 5B, flip-flops 128 and 130 are driven by the same pulse generator output via a single low-skew clock network. The output of flip-flop 128 drives the input of flip-flop 130 through a network having a delay represented by reference numeral 132. Each clock network is driven by one of the outputs of a pulse generator as disclosed herein, the flip-flop 128 being driven by the launch clock and the flip-flop 130 being driven by the capture clock. The pulse generator can precisely control the delay between launch and capture. The scheme illustrated in FIG. 5B works with any interval between launch and capture, even one less than the period of the clock used to generate the pulses.

The method of FIG. 5B can be used only if the design was implemented with two clocks. Designs intended especially for testing can be constructed this way. For example, a loop configuration such as the one shown in FIG. 3 having an even number of flip-flops would be well-suited for this purpose.

Figure 6:
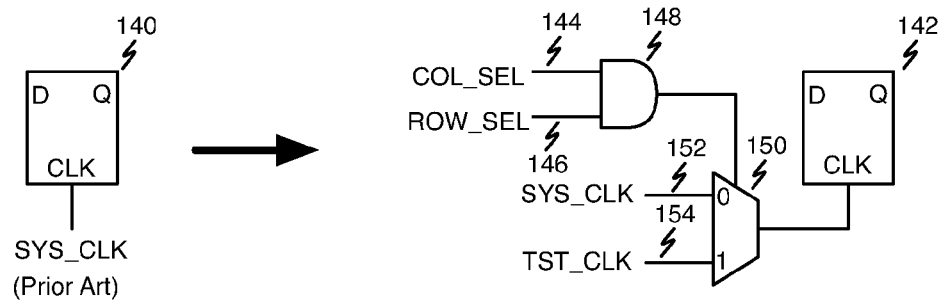
FIG. 6 is a block diagram illustrating an exemplary clock selection scheme.

End-user designs are not typically well suited to the two-clock scheme. For example, end-user designs may include state machines having a combinatorial path originating and terminating at the same flip-flop. This problem can be solved by adding some circuitry to each flip-flop. Such an arrangement is shown in FIG. 6, in which it is assumed that the flip-flops in the integrated circuit are arranged in rows and columns. The left hand side of FIG. 6 shows the normal connection for a flip-flop 140. On the right-hand side of FIG. 6, the modified circuitry to drive flip-flop 142 includes a column select control signal line 144 and a row select control signal line 146 to provide row-select and column-select signals ROW_SEL and COL_SEL for each row and column, respectively and are decoded through an AND gate 148. The output of the AND gate 148 drives a multiplexer 150 to select between the system clock signal SYS_CLK on line 152 and a test clock signal TST_CLK on line 154 to provide to each flip-flop.

During normal operation, all COL_SEL and ROW_SEL select lines 144 and 146 for the entire integrated circuit are at 0, and the normal system clock SYS_CLK on line 152 is routed to the flip-flop 142 through the multiplexer 150. In test mode, a specific flip-flop (e.g., 142) is addressed by raising the corresponding row and column select lines so that the AND gate 148 and multiplexer 150 pass the test clock signal TST_CLK from line 154 to the addressed flip-flop (142). During testing, OUT_0 of the pulse generator drives the system clock on line 152 and OUT_1 drives the test clock on line 154. Note that in addition to a specific single flip-flop 142 illustrated in FIG. 6, various sets of flip-flops, such as all those in one row, all those in one column, or all those in a specific set of rows and columns may be addressed.

An illustrative general launch-capture test procedure may be implemented using the pulse generator of FIG. 2. First, a desired launch-capture interval I is chosen to match the maximum allowable nominal delay of test path. A period T is chosen for the pulse generator input clock so that the clock can be conveniently produced by off-chip tester or by on-chip PLL. If I>T, the pulse generator is set with MC=0, N=floor (I/T), and $\Delta$=I−NT+$\Delta$0. The output OUT_0 of the pulse generator is connected to all flip-flops. If I<T, the pulse generator is set with MC=0, N=0, and $\Delta$=I+$\Delta$0. MC is the MC input to the pulse generator in FIG. 2. N is the initial value of the down counter as shown in Table 2. T is the period of the incoming clock. NT is the product of N and T.

If the scheme of FIG. 5B is being used, the clock inputs of the launch flip-flops 128 are connected to the pulse generator OUT_0, and the clock inputs of the capture flip-flops 130 are connected to the pulse generator OUT_1. If the scheme of FIG. 6 is being used, the pulse generator OUT_0 is connected to SYS_CLK on line 152 and the pulse generator OUT_1 is connected to TST_CLK on line 154. Then the relevant COL_SEL and ROW_SEL lines 144 and 146 are activated to select the desired capture flip-flops. The test pattern is shifted in using a scan chain or equivalent. The pulse generator is released to issue launch and capture pulses, and the test results are read from the flip-flops using the scan chain or equivalent.

It has been previously noted that defects can be detected by checking for significant delay differences between pairs of paths of matched nominal delay. The prior methods disclosed by Chmelar, Abramovici, and Stroud launch signals along both paths simultaneously and then measure the difference in arrival times at the ends of the paths. This requires relatively complex circuitry at the ends of each pair of paths. According to another aspect of the present invention, the two outputs of a centralized pulse generator are instead used to launch signals having a known differential delay along both paths. Then at the ends of the paths it suffices to merely determine in what order the signals arrived. This can be done with a relatively simple circuit referred to herein as an arrival order detector, (AOD), described further below. One central pulse generator can serve to launch signals along many pairs of matched paths.

Figure 7:
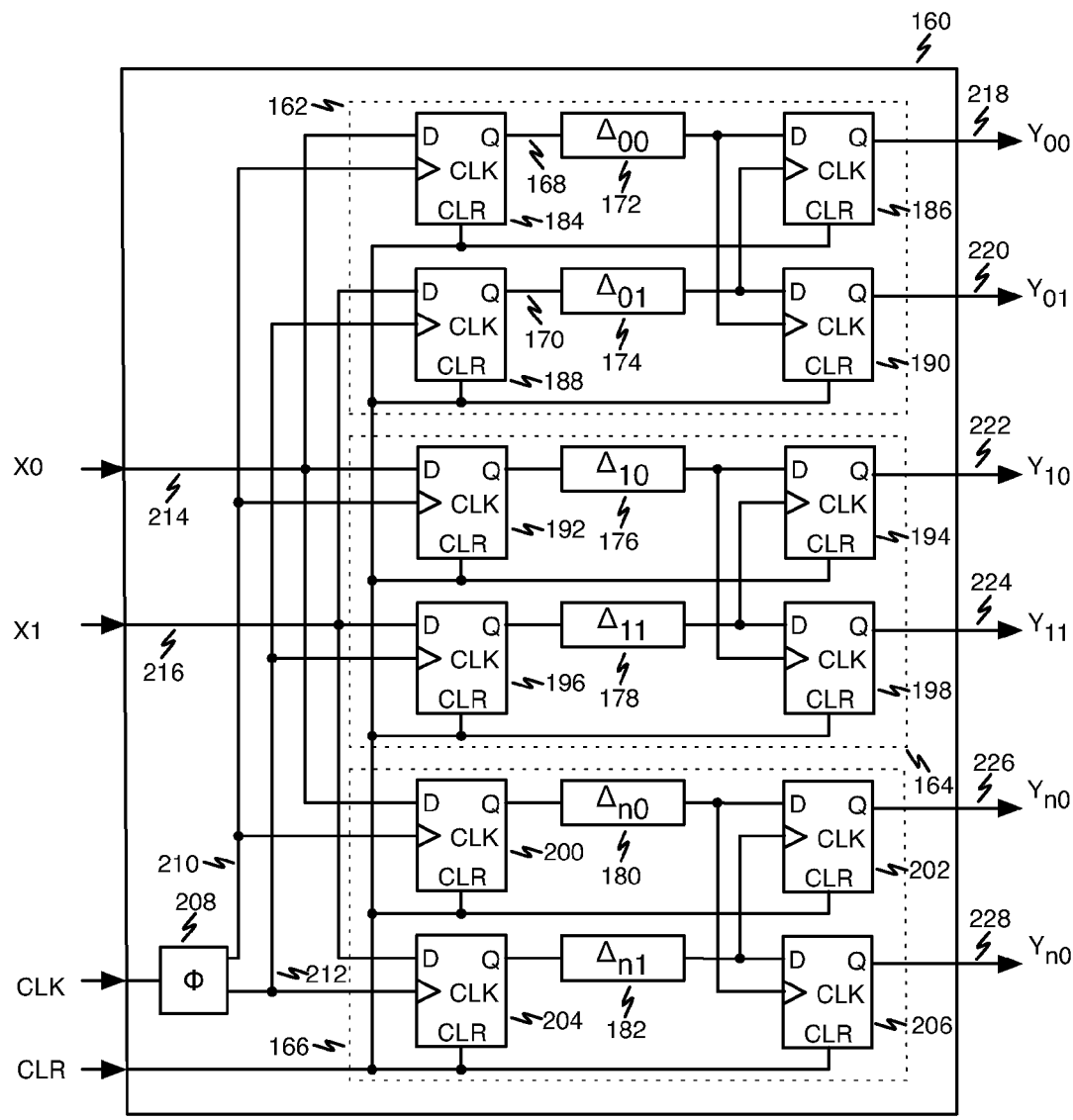
FIG. 7 is a block diagram showing an illustrative scheme for comparing delays of pairs of signal paths.

Referring now to FIG. 7, a block diagram illustrates the concept. An FPGA 160 is configured to have many pairs of paths, e.g., 162, 164, and 166. Each pair of paths includes two matched paths (e.g. 168 and 170 in pair 162), which should have nearly identical nominal delays, shown as $\Delta 00$ through $\Delta n1$ at reference numerals 172 through 182 between flip-flop pairs 184/186, 188/190, 192/194, 196/198, 200/202, and 204/206. As an example, in an ideal good device, $\Delta 00 = \Delta 01$, $\Delta 10 = \Delta 11$; in general, $\Delta n0 = \Delta n1$ is expected. On the other hand, the scheme of the present invention allows for significant differences in nominal delays from one pair of matched paths to another (e.g., $\Delta 00 \neq \Delta 10$).

In an illustrative embodiment, the flip-flops shown are part of the programmable ("soft") logic. However they could also be implemented by dedicated ("hard") logic intended specifically for testing.

A pulse generator 208, such as the ones shown in FIG. 1 or FIGS. 2A through 2C, can generate two synchronized global on-chip clocks signals 210 and 212 with a certain phase difference $\phi$ in between them. Data signals X0 and X1 may be provided to the flip-flops on lines 214 and 216.

The differentially delayed signals on lines 214 and 216 can be delivered to the launch flip-flops using the global low-skew distribution nets that are typically provided in FPGAs. This limits any additional change in the chosen differential delay. The outputs of the pairs Y00/Y01, Y10/Y11, and Yn0/Yn1, are shown at reference numerals 218/220, 222/224, and 226/228.

Figure 8:
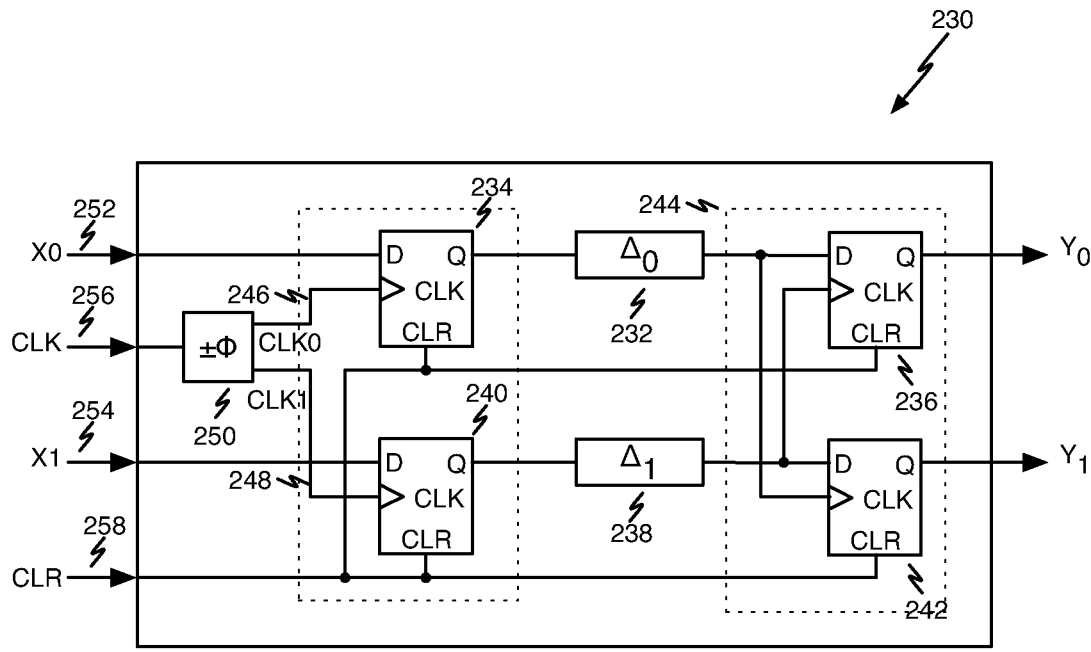
FIG. 8 is a block diagram showing an illustrative circuit for testing slow-to-rise faults in accordance with the present invention.
Figure 9:
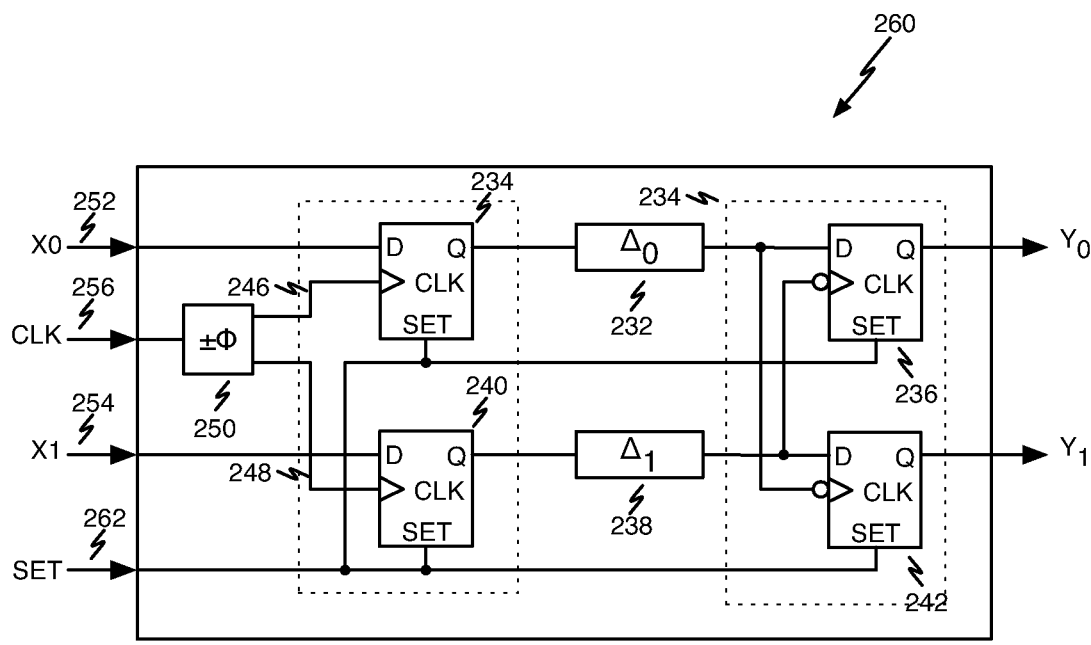
FIG. 9 is a block diagram showing an illustrative circuit for testing slow-to-fall faults in accordance with the present invention.

To test slow rising as well as slow falling edge delays, two slightly different pair-of-path circuits are used. Referring now to FIGS. 8 and 9, two exemplary pair-of-path circuits are shown. The circuits of FIGS. 8 and 9 are similar to one another. The operation of the circuit 230 shown in FIG. 8 will be described in detail. Differing details in the operation of the circuit of FIG. 9 will be addressed.

Referring now to FIG. 8, delay block 232 in circuit 230 represents a path through some programmable routing and logic and its corresponding delay between the output of flip-flop 234 and the input of flip-flop 236. Similarly, delay block 238 represents a path through some programmable routing and logic and its corresponding delay between the output of flip-flop 240 and the input of flip-flop 242. Each path starts at a flip-flop and ends at a flip-flop inside a detector indicated by dashed box 244. Other than at start and end, there are no other flip-flops in the paths.

Path 232 with a nominal delay of $\Delta_0$ starts at the output of flip-flop 234 and ends at the input of flip-flop 236, while the second path 238 with a nominal delay of $\Delta_1$ starts at the output of flip-flop 240 and ends at the input of flip-flop 242. In each pair-of-paths circuit, one flip-flop 234 is clocked by a clock signal designated CLK0 at reference numeral 246 and the other flip-flop 240 is clocked by a clock signal designated CLK1 at reference numeral 248 from clock generator 250. While the data input of a detector flip-flop is connected to one path, the clock input of the same flip-flop is connected to the second path. Thus, the data input of flip-flop 236 is connected to the end of path 232, while the clock input is connected to the end of path 238. This same cross-over connectivity is used for the second detector flip-flop 242.

The circuit 230 of FIG. 8 may be used to test for slow-to-rise delay faults. First, the pulse generator 250 is set to deliver a certain phase difference $\phi$ between both clocks 246 and 248. Flip-flops 234, 236, 240, and 242 are cleared by asserting the clear input 258, and data inputs X0 (reference numeral 252) and X1 (reference numeral 254) are set to logic "1". An input clock pulse on line 256 is applied to both flip-flops 234 and 240, launching a rising edge on both paths 232 and 238 with an offset $\phi$. The state of detector 244 is then observed.

Table 3 shows the expected results as a function of phase $\phi$ as $\phi$ is swept from negative to positive values. Person skilled in the art will observe that the 0 ps phase delay could also result in outputs 1,1 for Y0 and Y1 depending on the setup time of the detector flip-flops 236 and 242.

TABLE 3

| $\phi$ | Y0 | Y1 |
|---|---|---|
| −1000 ps | 0 | 1 |
| −900 ps | 0 | 1 |
| ... | | |
| 0 ps | 0 | 0 |
| ... | | |
| 900 ps | 1 | 0 |
| 1000 ps | 1 | 0 |

Referring now to FIG. 9, it may be seen that the circuit 260 is the same as the circuit 230 of FIG. 8 except that a SET input to the flip flops on line 262 is used in place of the CLEAR input on line 258 in FIG. 8. Also, the clock inputs on arrival order detector flip-flops 236 and 242 are inverted. Other elements of the circuit remain the same and are referred to using the same reference numerals that are used in FIG. 8. The circuit of FIG. 9 may be used to test for slow-to-fall delay faults.

In some FPGAs, implementing both FIG. 8 and FIG. 9 may require reprogramming the device to invert the phase of the clock input at each flip-flop. There are various ways reprogramming for this purpose can be avoided, such as using an additional dynamic global signal to select the function of either FIG. 8 or 9; this signal would be EXORed with the clock at each flip-flop input. If necessary, this feature could be implemented in dedicated circuitry that is part of the flip-flop.

The method for detecting unexpectedly large delay differences between pairs of matched paths according to the present invention has several advantages over the prior art. First, the method of the present invention does not require a high-speed clock and is largely independent of the clock frequency. The method of the present invention provides improved efficiency for measuring delays caused by defects, known as delay fault values. Using the methods of the present invention, the delay change can be directly measured. By sweeping phase $\phi$ through a range, the distribution of delay differences in the various paths can be easily determined. As an example, when starting at minimum or maximum phase value and proceeding towards phase offset 0, an increasing number of pair-of paths circuits will change the value from 01 or 10 to 00 or 11. Measuring the number of such switching pair-of-path circuits gives the number of pairs with a given delay difference. This helps determine the range of delay differences that is normal so that an appropriate threshold can be set for delay differences indicating defects. There is no FPGA reprogramming required for changing the phase value $\phi$.

Figure 10:
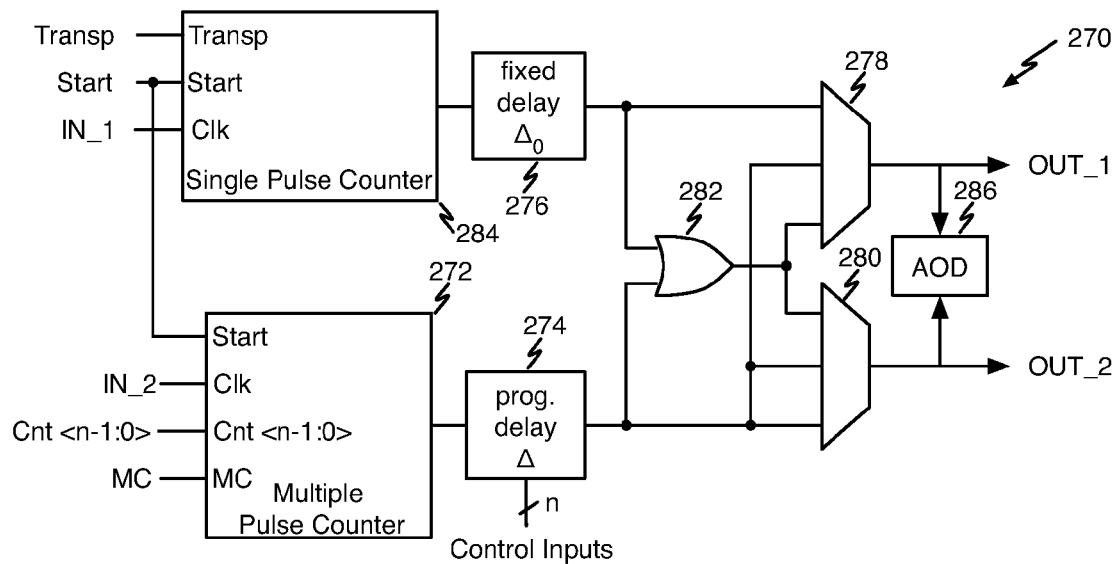
FIG. 10 is a block diagram showing an illustrative basic pulse generator circuit with a second input and added arrival order detector in accordance with the present invention.

Referring now to FIG. 10, a block diagram shows how some extra circuitry can be added to a pulse generator such as the one depicted in FIG. 2A to enable it to test clock-conditioning circuits (CCC) such as a PLL or DLL. As in the pulse generator circuit of FIG. 2A, the pulse generator 270 of FIG. 10 has two outputs, OUT_1 and OUT_2. The previously common clock input CLK is split into two, IN_1 and IN_2. Pulse generator 270 includes a pulse counter 272 that may be set by means of the CNT<n−1:0> inputs to pass a specified number of clock pulses after which its output remains low. A programmable delay 274 is coupled to the output of pulse counter 272 and may be set by means of control inputs to delay the signal appearing at its input by a specified delay before sending it out. A fixed delay 276 compensates for the minimum delay through the programmable delay 274. Multiplexers 278 and 280 select one of the output of the programmable delay 274 and the fixed delay 276 to their inputs to pass through to one of the two outputs OUT_1 and OUT_2. Because the output of each delay line can be routed through multiplexers 278 and 280 to either pulse generator output, OUT_1 can either be ahead of or behind OUT_2 if the inputs of both multiplexers 278 and 280 coupled to the OR gate are selected.

The single pulse counter 284 block can be either transparent to the incoming clock or will create a single pulse; this is selected by the input signal TRANSP. An arrival order detector circuit (AOD) 286 compares the two pulse generator output signals to see which one rises first and report this to an on-chip test controller or external tester. The arrival order detector circuit 286 can be implemented by two cross-coupled flip-flops, as shown in FIGS. 8 and 9. To support rising and falling edge testing, the inputs to the arrival order detector circuit 286 can be provided with programmable inverters (not shown).

Figure 11A:
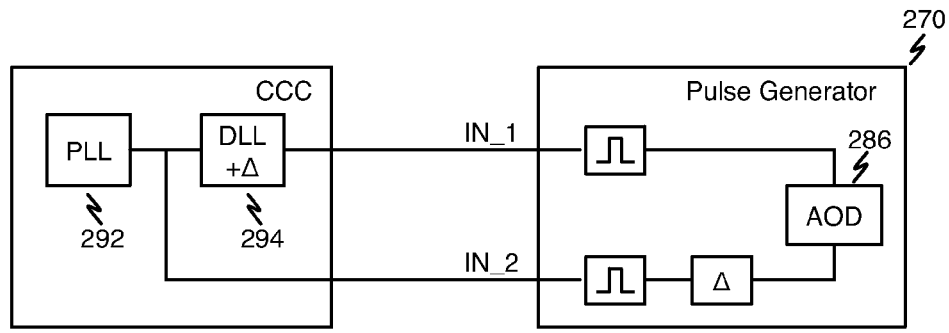
FIGS. 11A and 11B are block diagrams showing an illustrative clock phase and delay testing concept in accordance with the present invention.
Figure 11B:
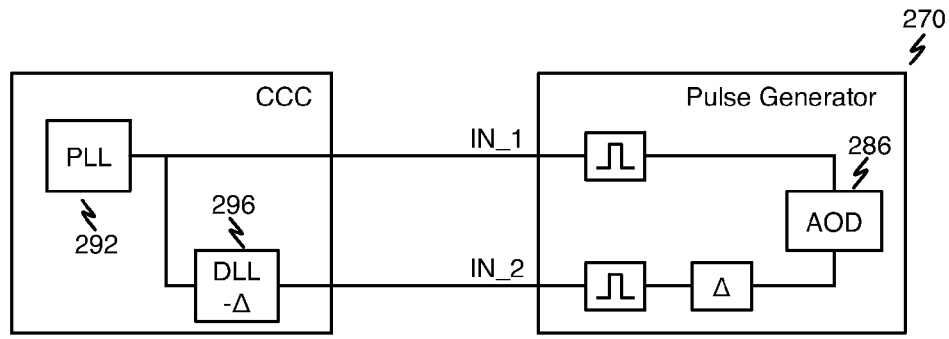

FIGS. 11A and 11B show how the pulse generator circuit 270 of FIG. 10 can be used to test the selected delay of a DLL. In the circuit of FIG. 11A, the output of PLL 292 is presented to the input IN_2 of the pulse generator circuit 270 and the output of +Δ DLL 294 is presented to the input IN_1 of the pulse generator circuit 270. In the circuit of FIG. 11B, the output of PLL 292 is presented to the input IN_1 of the pulse generator circuit 270 and the output of −Δ DLL 296 is presented to the input IN_2 of the pulse generator circuit 270.

In both FIGS. 11A and 11B, the phase shift between two different clocks (the outputs of the PLL and DLL) is compensated for by the programmable delay of the pulse generator circuit 270. Because the programmable delay of the pulse generator can only slow down the path, input IN_2 should receive the clock with the earlier phase, so that the phase difference between the two inputs at the AOD 286 is minimized.

In general, this aspect of the present invention is used to verify the delay of a certain clock edge relative to a reference clock edge. Therefore this scheme can also be used, for example, to test for the proper phase shift between two outputs of a PLL.

Figure 12:
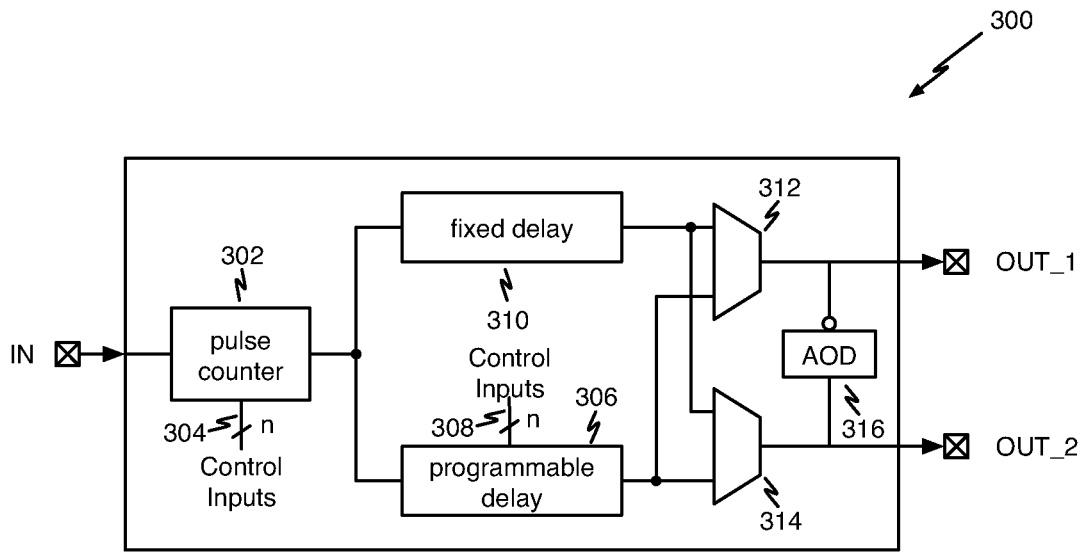
FIG. 12 is a block diagram showing an illustrative circuit for duty cycle estimation in accordance with the present invention.

The present invention may also be used to estimate the location of the falling edge of the clock relative to its rising edge. This aspect of the invention is illustrated in FIG. 12, to which attention is now drawn. Pulse generator 300 uses some of the same components as does pulse generator 270 of FIG. 10, and it is obviously possible to generalize the circuit of FIG. 10 so as to allow it to emulate the function of FIG. 12. Thus, pulse generator 300 includes pulse counter 302 that may be set by means of control inputs 304 to pass a specified number of clock pulses after which its output remains low. A programmable delay 306 is coupled to the output of pulse counter 302 and may be set by means of control inputs 308 to delay the signal appearing at its input by a specified delay before sending it out. A fixed delay 310 compensates for the minimum delay through the programmable delay 306. Multiplexers 312 and 314 select one of the output of the programmable delay 306 and the fixed delay 310 to their inputs to pass through to one of the two outputs OUT_1 and OUT_2. In addition, by inverting the top input to the arrival order detector circuit 316 as shown in FIG. 12 and sending the same clock to both inputs of the arrival order detector circuit 316, the location of the falling edge of the clock relative to its rising edge can be estimated; this allows the duty cycle of the clock to be estimated.

The accuracy with which the interval between two clock edges can be determined is limited by the programmable delay step width (typically ~80 psec). Due to the maximal differential delay in the pulse generator of $\Delta_{max}$-$\Delta_0$, this concept will work only with certain limitations on clock frequency and cycle coverage. For example, with the pulse counter 302 in the pulse generator set by control inputs 304 to count 32 pulses, $\Delta_{max}$-$\Delta_0$=32×80 psec=2.56 ns. This would suffice to test the entire clock cycle of a 400 MHz clock, or a ±45 degree phase shift in a 50 MHz clock. Various techniques may be used to limit the delay difference to be verified to keep it within the limits of the pulse generator. These include use of inverted clocks, or a combination of DLL delays with PLL phase outputs.

It is sometimes useful to sample a clock waveform at various points in time, as another way to verify that the duty cycle of the clock is within limits.

Figure 13:
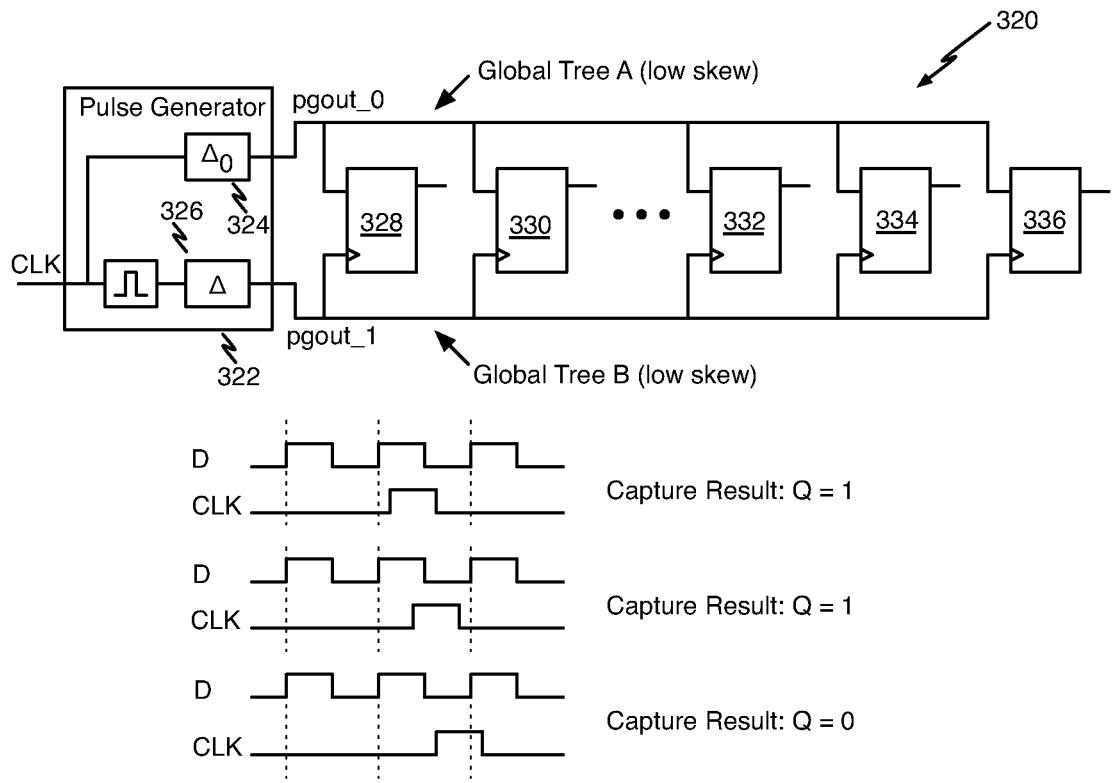
FIG. 13 is a block diagram illustrating clock sampling and relative skew testing in accordance with the present invention.

This can be done as shown in the circuit 320 of FIG. 13. The free running clock CLK is supplied to a pulse generator 322 where it is delayed by $\Delta_0$ in delay 324 and by $\Delta$ in delay 326. The output of delay $\Delta_0$ is sent to a D input of a flip flop 328 and a single delayed pulse of the clock to the clock input of the flip-flop 328. Multiple flip-flops (shown at reference numerals 330, 332, 334, and 336) driven in parallel by two low-skew global networks can also be used, allowing estimation of the relative skews between the two networks at various points. Typical waveforms at any one of the flip-flops are shown in the lower half of the figure. The D input of the flip-flop 328 receives the free-running clock. The clock input of the flip-flop 328 receives a single delayed pulse. The flip-flop will sample the free-running clock at some point, depending on the offset of the delayed pulse from the original clock, and the relative skew on global tree A vs B.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit including:
    a clock input;
    a first output;
    a second output;
    a fixed delay element having an input coupled to the clock input and an output;
    a programmable delay element having an input coupled to the clock input, an output, and at least one control input for receiving delay information;
    a first multiplexer having a first data input coupled to the output of the fixed delay element, a second data input coupled to the output of the programmable delay element, an output coupled to the first output, and a control input; and
    a second multiplexer having a first data input coupled to the output of the programmable delay element, a second data input coupled to the output of the fixed delay element, an output coupled to the second output, and a control input.

2. The integrated circuit of claim 1, wherein:
    the fixed delay element is coupled to the clock input through a programmable pulse counter having an input coupled to the clock input, an output, and at least one control input for receiving count information; and
    the programmable delay element is coupled to the clock input through the programmable pulse counter.

3. The integrated circuit of claim 1, further including an arrival order detector circuit coupled between the first output and the second output.

4. The integrated circuit of claim 3, wherein the arrival order detector circuit includes:
    a first flip-flop having a clock input coupled to the programmable delay element and a data input coupled to the fixed delay element; and
    a second flip-flop having a clock input coupled to the fixed delay element and a data input coupled to the programmable delay element.

5. The integrated circuit of claim 4 further including a CLEAR signal line connected to a CLEAR input of the first flip-flop and a CLEAR input of the second flip-flop.

6. The integrated circuit of claim 4 further including a SET signal line connected to a SET input of the first flip-flop and a SET input of the second flip-flop.

7. The integrated circuit of claim 1, further including:
    a multicycle control input:
    a down counter coupled to the clock input and having at least one control input to receive a control input specifying clock N pulses; and wherein:
    the fixed delay element is coupled to the clock input through a first timing circuit responsive to signals from the down counter and the multicycle control input; and
    the programmable delay element is coupled to the clock input through a second timing circuit responsive to signals from the down counter and the multicycle control input.

8. The integrated circuit of claim 7 wherein:
    the first and second timing circuits simultaneously pass N clock pulses from the clock input to the fixed delay element and the programmable delay element when the multicycle control input is in a first logic state; and
    the first timing circuit passes a first of N clock pulses from the clock input to the fixed delay element and the second timing circuit passes an (N+1)th clock pulse to the programmable delay element when the multicycle control input is in a second logic state opposite the first logic state.

9. The integrated circuit of claim 8, further including:
    an OR gate having a first input coupled to the fixed delay element, a second input coupled to the programmable delay element, and an output coupled to a third data input of the first multiplexer and a third data input of the second multiplexer.

* * * * *